(12) United States Patent
Kim et al.

(10) Patent No.: US 11,437,743 B2
(45) Date of Patent: Sep. 6, 2022

(54) ELECTRICAL CONNECTOR

(71) Applicant: SENSORVIEW CO., LTD., Gyeonggi-do (KR)

(72) Inventors: Byoung Nam Kim, Gyeonggi-do (KR); Kyoung Il Kang, Gyeonggi-do (KR); Dong Il Yim, Gyeonggi-do (KR)

(73) Assignee: SENSORVIEW CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/410,417

(22) Filed: Aug. 24, 2021

(65) Prior Publication Data
US 2022/0255251 A1 Aug. 11, 2022

(30) Foreign Application Priority Data
Feb. 9, 2021 (KR) .................. 10-2021-0017981

(51) Int. Cl.
| | |
|---|---|
| *H01R 13/00* | (2006.01) |
| *H01R 12/65* | (2011.01) |
| *H01R 12/59* | (2011.01) |
| *H01R 13/40* | (2006.01) |
| *H01R 13/516* | (2006.01) |
| *H05K 1/11* | (2006.01) |

(52) U.S. Cl.
CPC .......... *H01R 12/65* (2013.01); *H01R 12/592* (2013.01); *H01R 13/40* (2013.01); *H01R 13/516* (2013.01); *H05K 1/118* (2013.01)

(58) Field of Classification Search
CPC ............ H01R 13/5808; H01R 2103/00; H01R 13/5833; H01R 13/506; H01R 13/516
See application file for complete search history.

(56) References Cited

U.S. PATENT DOCUMENTS

| | | | | |
|---|---|---|---|---|
| 5,315,679 | A * | 5/1994 | Baldwin ............. | G02B 6/3869 385/76 |
| 5,466,175 | A * | 11/1995 | Onoda ............... | H01R 13/5808 439/95 |
| 6,602,090 | B2 * | 8/2003 | Kato .................. | H01R 13/5205 439/455 |
| 7,442,072 | B2 * | 10/2008 | Droesbeke ......... | H01R 13/5808 439/471 |
| 7,503,776 | B1 * | 3/2009 | Pavlovic .......... | H01R 13/65914 439/98 |
| 7,901,239 | B2 * | 3/2011 | Weber ............... | H01R 13/7197 439/607.47 |

* cited by examiner

*Primary Examiner* — Phuong Chi Thi Nguyen
(74) *Attorney, Agent, or Firm* — Harness, Dickey & Pierce, P.L.C.; Kisuk Lee

(57) ABSTRACT

An electrical connector is provided. The electrical connector may include a body; a terminal portion disposed on the body; and a flexible printed circuit board (FPCB) electrically connected to the terminal portion, wherein the body includes a first part on which the terminal portion is disposed, a second part disposed on one side of the first part in a vertical direction, and a third part disposed on the other side of the first part and coupled to the second part, the FPCB includes a first region and a second region extending from the first region and including a contact point connected to the terminal portion, and the second region is disposed between the first part and the third part in a front-to-rear direction and is fixed to the first part.

10 Claims, 16 Drawing Sheets

ELECTRICAL CONNECTOR

CROSS-REFERENCE TO RELATED APPLICATION

This application claims the benefit under 35 USC § 119(a) of Korean Patent Application No. 10-2021-0017981, filed on Feb. 9, 2021, in the Korean Intellectual Property Office, the entire disclosure of which is incorporated herein by reference for all purposes.

FIELD

The following description relates to an electrical connector, and to an electrical connector in which a portion of a flexible printed circuit board (FPCB) is bent for connection.

BACKGROUND

An electrical connector is a device used for data communication with or power supply to an external device. An electrical connector in the form of a female connector includes a terminal portion in which a plurality of socket type terminals are disposed. The terminal portion may be disposed in a body of the electrical connector. Each terminal may be disposed along a front-to-rear direction, which is the direction in which a pin of a male connector is inserted. Also, each terminal may be electrically connected to a flexible printed circuit board (FPCB).

The FPCB may be fixed to the body through a fastening member. In general, an FPCB, while being laminated in a manner to vertically overlap a body, may be fixed onto the body via a fastening member coupled in the vertical direction. Hence, a space in which the fastening member is coupled must be sufficiently secured in the front-to-rear direction in the body. In addition, when the body is configured with several parts surrounding a terminal portion, a space is also required to insert fastening members for coupling the parts to each other. For these reasons, the overall size of the body increases, which leads to increases in the size and weight of the electrical connector.

Further, in order for the terminal arranged along the front-to-rear direction to be connected perpendicularly to the FPCB, the end of the terminal connected to the FPCB must be bent toward the FPCB. Thus, the manufacturing process of the terminal is complicated and the terminal has a structural problem in that it is easily damaged by the impact applied in the front-to-rear direction.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

An object of the present invention is to provide an electrical connector with reduced size and weight which can secure rigidity of a terminal.

The objects to be achieved by the present invention are not limited to the foregoing object, and additional objects, which are not mentioned herein, will be readily understood by those skilled in the art from the following description.

In one general aspect, there is provided an electrical connector including: a body, a terminal portion disposed on the body, and a flexible printed circuit board (FPCB) electrically connected to the terminal portion, wherein the body includes a first part on which the terminal portion is disposed, a second part disposed on one side of the first part in a vertical direction, and a third part disposed on the other side of the first part and coupled to the second part, the FPCB includes a first region and a second region extending from the first region and including a contact point connected to the terminal portion, and the second region is disposed between the first part and the third part in a front-to-rear direction and is fixed to the first part.

Preferably, the electrical connector may include a first fastening portion passing through the body in the front-to-rear direction and rotatably disposed on the body, and the first fastening portion may be disposed to pass through an overlapping area of the first part, the second region of the FPCB, and the third part in the front-to-rear direction, wherein a threaded region of the first fastening portion may be disposed to be exposed from the front of the first part.

Preferably, the electrical connector may further include a second fastening portion for coupling the second part and the third part in the vertical direction, the second part may include a first surface, the third part may include a second surface, and as the second part and the third part are coupled by the second fastening portion, the first surface and the second surface may pressurize the first part in the vertical direction to fix the first part to the second part and the third part.

Preferably, the first part may include a first hole, the second region of the FPCB may include a second hole aligned with the first hole, the electrical connector may further include a hollow component which passes through the first hole and the second hole to fix the FPCB to the first part, and the first fastening portion may be disposed to pass through the hollow component.

Preferably, the terminal portion may include an insulator disposed on the first part and a plurality of straight terminals disposed on the insulator in the front-to-rear direction and electrically connected to the contact point, and the second region of the FPCB may be disposed perpendicular to the straight terminals.

Preferably, the third part may include a second base including the second surface, and a second rear wall portion protruding from the second base and disposed to overlap the first part in the front-to-rear direction, and the second region may be disposed between the first part and the second rear wall portion in the front-to-rear direction.

Preferably, the second rear wall portion may include a first groove concavely disposed on an outer surface and a third hole disposed in the first groove, the first fastening portion may be disposed to pass through the third hole, the second region, and the third part, and a head of the first fastening portion may be disposed in the first groove.

Preferably, the second part may include a first base including the first surface, and a first rear wall portion protruding from the first base and disposed to overlap the first part in the front-to-rear direction, the first rear wall portion may include a third surface and a fourth surface, the second rear wall portion may include a fifth surface that is in contact with the third surface in the vertical direction, and the fourth surface may be disposed to be stepped with respect to the third surface so that the fourth surface and the fifth surface may together form a space therebetween through which the first region passes.

Preferably, the second part may include a first base including the first surface, and a first rear wall portion protruding from the first base and disposed to overlap the first part in the front-to-rear direction, and the first rear wall portion may be in contact with a rear surface of the first part to support the first part so as not to be pushed rearward.

Preferably, the second part may include a protrusion protruding from the first surface, and the first part may include a second groove concavely formed on a surface in contact with the first surface, wherein the protrusion is disposed in the second groove, thereby restraining the first part in the front-to-rear direction.

Other features and aspects will be apparent from the following detailed description, the drawings, and the claims.

Figure 1:
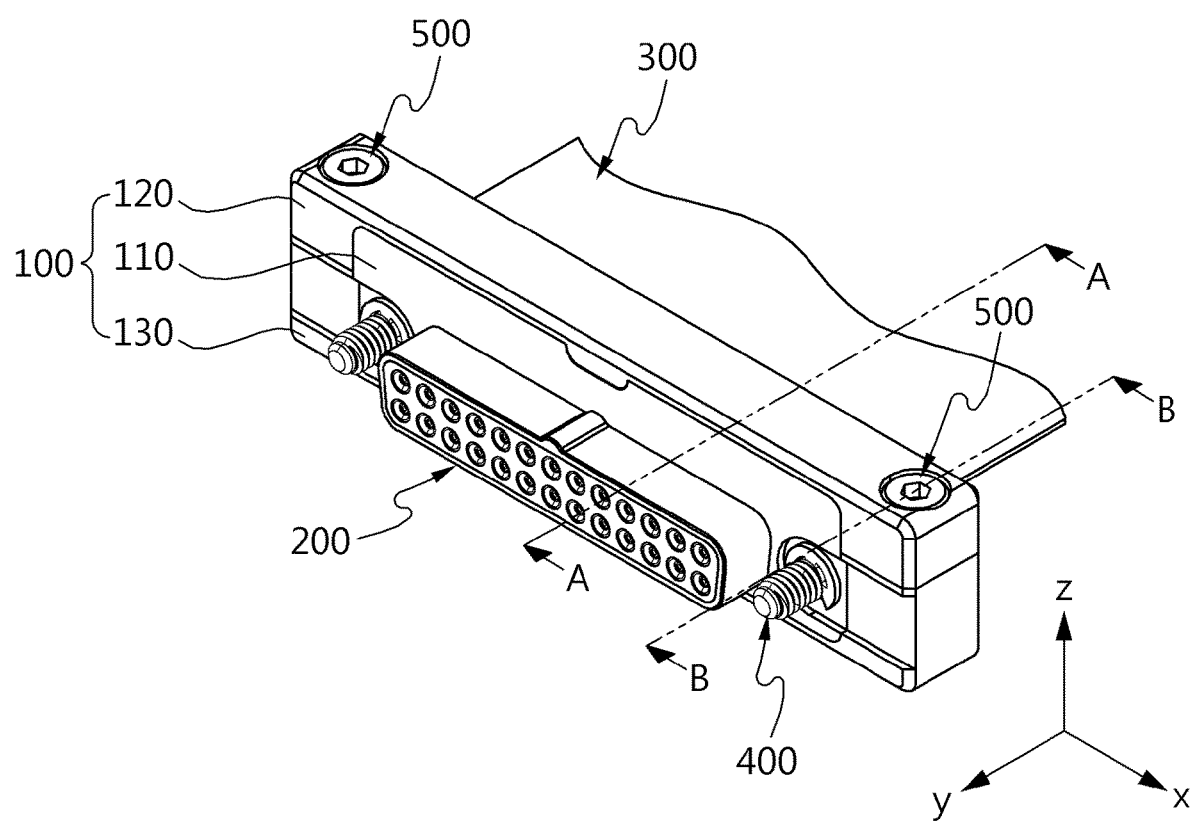
FIG. 1 is a perspective view of an electrical connector according to an embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

The objects, features and advantages of the present invention will be more clearly understood from the following detailed description and preferred embodiments taken in conjunction with the accompanying drawings. It should be understood that terms or words used in the specification and the appended claims should not be construed as being limited to commonly employed meanings or dictionary definitions, but interpreted based on meanings and concepts corresponding to the technical idea of the invention, on the basis of the principle that inventors are allowed to define terms appropriately for the best explanation of their invention. Further, in the description of the present invention, detailed descriptions of related well-known functions that are determined to unnecessarily obscure the gist of the present invention will be omitted.

In describing the elements of this specification, terms, such as the first, second, A, B, a, and b, may be used. However, the terms are used to only distinguish one element from other elements, but the essence, order, and sequence of the elements are not limited by the terms.

FIG. 1 is a perspective view of an electrical connector according to an embodiment.

Herein, in describing embodiments, a "front-to-rear" direction refers to a coupling direction of an electrical connector. Hereinafter, in drawings, an x-axis represents a left-to-right direction of the electrical connector, a y-axis represents a front-to-rear direction of the electrical connector, and a z-axis represents a vertical direction of the electrical connector. In addition, as used herein, the term "horizontal," and grammatical variants thereof, refers to a direction parallel to an x-y plane.

Referring to FIG. 1, the electrical connector may include a body 100, a terminal portion 200, a flexible printed circuit board (FPCB) 300, a first fastening portion 400, and a second fastening portion 500.

The terminal portion 200 may be disposed inside the body 100. The body 100 may have a hexahedral shape elongated in the left-to-right direction x. An inlet of the terminal portion 200 is exposed to the front of the body 100 and the FPCB 300 may be disposed at the rear of the terminal portion 200. The body 100 may include a first part 110, a second part 120, and a third part 130.

The second part 120 and the third part 130 are arranged in the vertical direction z, and form a space to accommodate the first part 110. The space in which the first part 110 is accommodated has a shape with an open front. The first part 110 is accommodated in the space formed by the second part 120 and the third part 130 so as to be exposed to the front surface. The first part 110 has a space formed therein to accommodate the terminal portion 200.

The terminal portion 200 is accommodated inside the first part 110. The terminal portion 200 is disposed to extend in the left-to-right direction x.

The FPCB 300 may be disposed at the rear of the terminal portion 200 so as to be electrically connected to the terminal portion 200.

The first fastening portion 400 is disposed passing through the body 100 from the rear to the front of the body 100. The first fastening portion 400 is disposed such that a threaded region thereof protrudes from the front of the body 100. Also, the first fastening portion 400 is rotatably disposed on the body 100. Further, the first fastening portion 400 may be disposed on each side of the terminal portion 200 in the left-to-right direction x.

The first fastening portion 400 is for engaging with a mating connector, such as a male connector.

The second fastening portion 500 is a member for coupling the second part 120 and the third part 130 of the body 100. The second fastening portion 500 may be coupled to the third part 130, passing through the second part 120 in the vertical direction z. The second fastening portion 500 may be a threaded bolt. The second fastening portion 500 may be disposed outside the first fastening portion 400 in the left-to-right direction x. That is, the second fastening portion 500 is disposed so as not to overlap the terminal portion 200 and the first fastening portion 400 in the vertical direction z.

The space occupied by each of the terminal portion 200, the first fastening portion 400, and the second fastening portion 500 in the body 100 determines the length of the body 100 in the left-to-right direction x.

Figure 2:
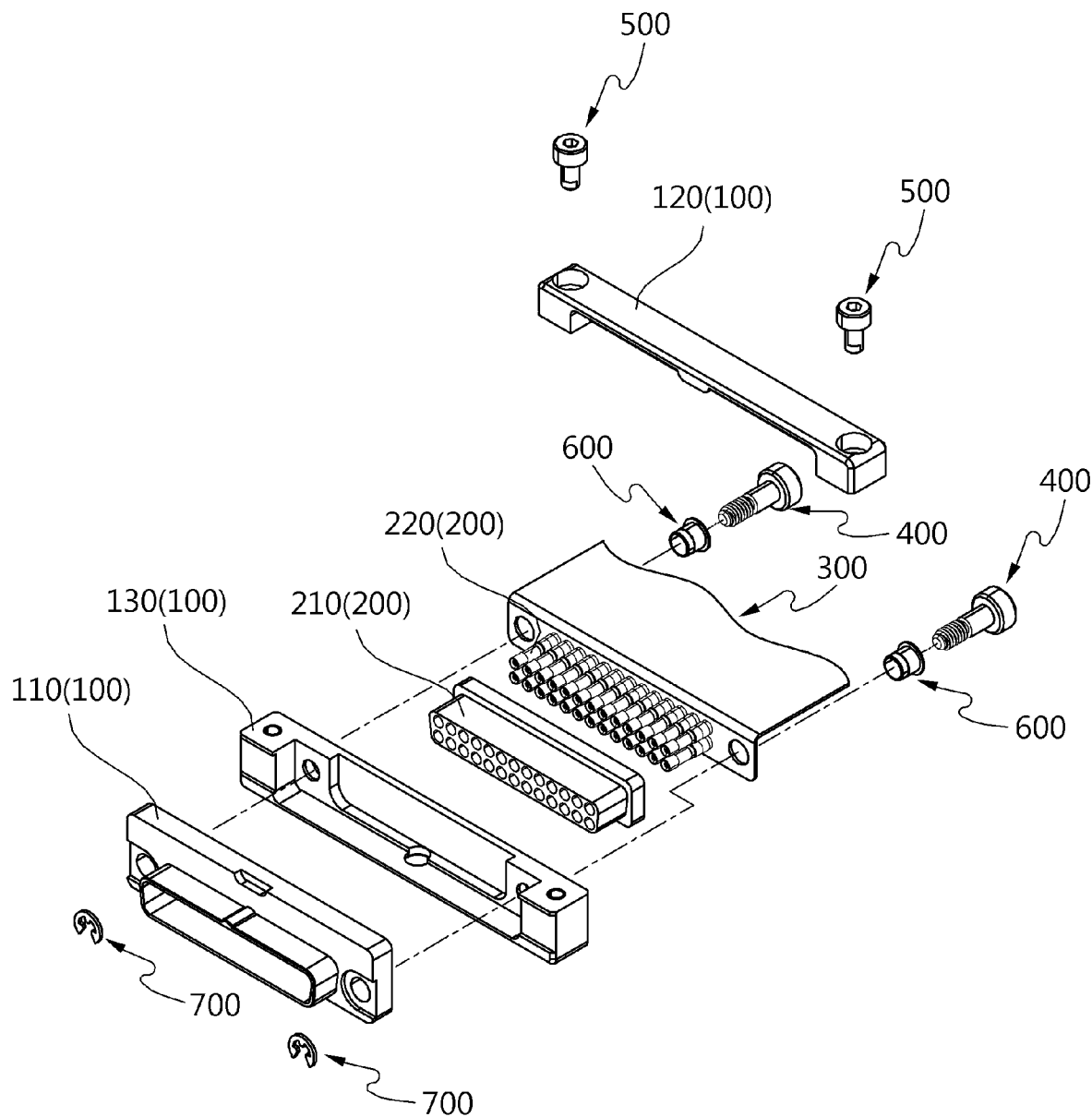
FIG. 2 is an exploded view of the electrical connector shown in FIG. 1.

FIG. 2 is an exploded view of the electrical connector shown in FIG. 1.

Referring to FIG. 2, the terminal portion 200 may include an insulator 210 and a plurality of terminals 220. The terminals 220 are disposed inside the insulator 210. The terminals 220 are arranged along the front-to-rear direction y. The FPCB 300 is disposed at the rear of the terminal portion 200 along the front-to-rear direction y, and a portion of the FPCB 300 in contact with the terminals 220 is bent and disposed along the vertical direction z.

The FPCB 300 may be fixed to the first part 110 through a hollow component 600. The hollow component 600 is fixed to the first part 110, passing through the FPCB 300. The first fastening portion 400 passes through the hollowing component 600 and protrudes from the front of the first part 110. A fixing component 700 seating on the front surface of the first part 110 is fixed to the first fastening portion 400, so that the first fastening portion 400 is fixed so as not to move in the front-to-rear direction y.

Figure 3:
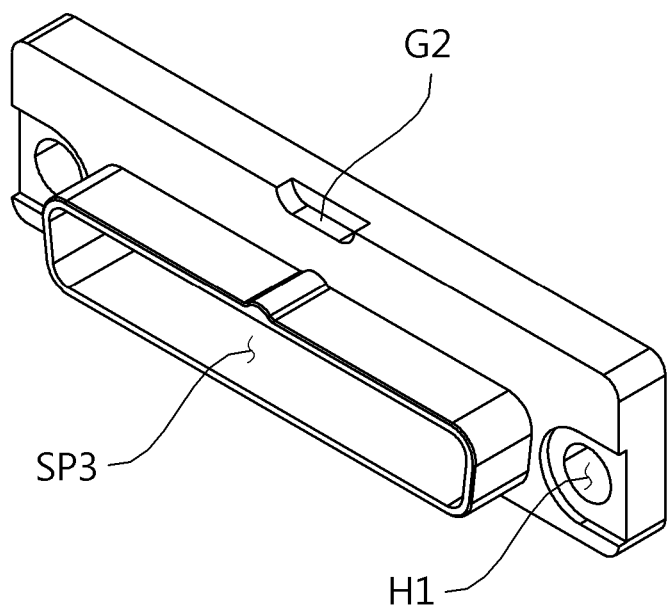
FIG. 3 is a view of a first part.

FIG. 3 is a view of the first part 110.

Referring to FIG. 3, the first part 110 has a space part SP3 formed therein in which the terminal portion 200 of the first part 110 is accommodated. The first part 110 may include a first hole H1. The hollow component 600 and the first fastening portion 400 pass through the first hole H1. The first hole H1 may be disposed at each end of the first part 110 in the left-to-right direction x. In addition, the first part 110 may include a second groove G2. A protrusion (121a in FIG. 4) of the second part 120 is inserted into the second groove G2.

The second groove G2 may be disposed at the center of the first part 110 in the left-to-right direction x. Also, the second groove G2 may be concavely formed on one surface of the first part 110 in contact with a first surface 51 of the second part 120. In the process of coupling the second part 120 and the third part 130, when the protrusion 121a is inserted into the second groove G2, the protrusion 121a restrains the first part 110 in the front-to-rear direction y and in the vertical direction z, thereby preventing the first part 110 from dislodging forward or vertically from the second part 120 and the third part 130.

Figure 4:
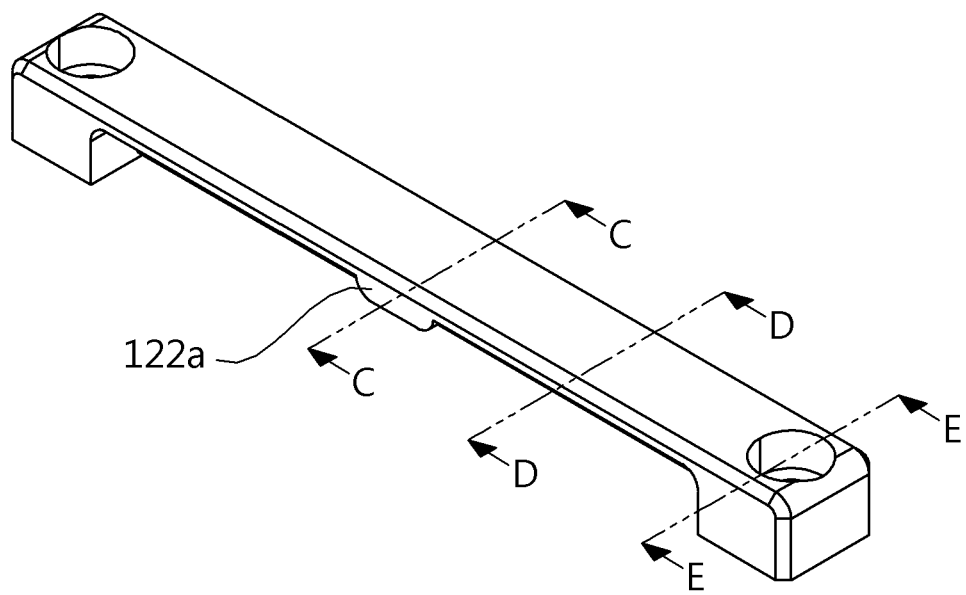
FIG. 4 is a perspective view of a second part.
Figure 5:
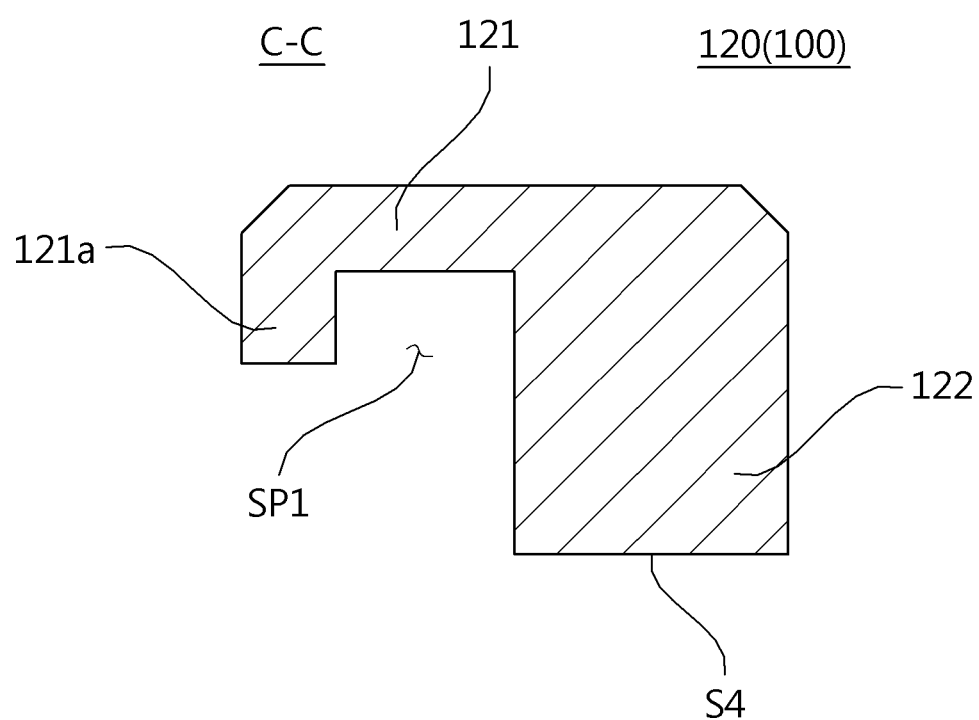
FIG. 5 is a cross-sectional view of the second part taken along line C-C of FIG. 4.
Figure 6:
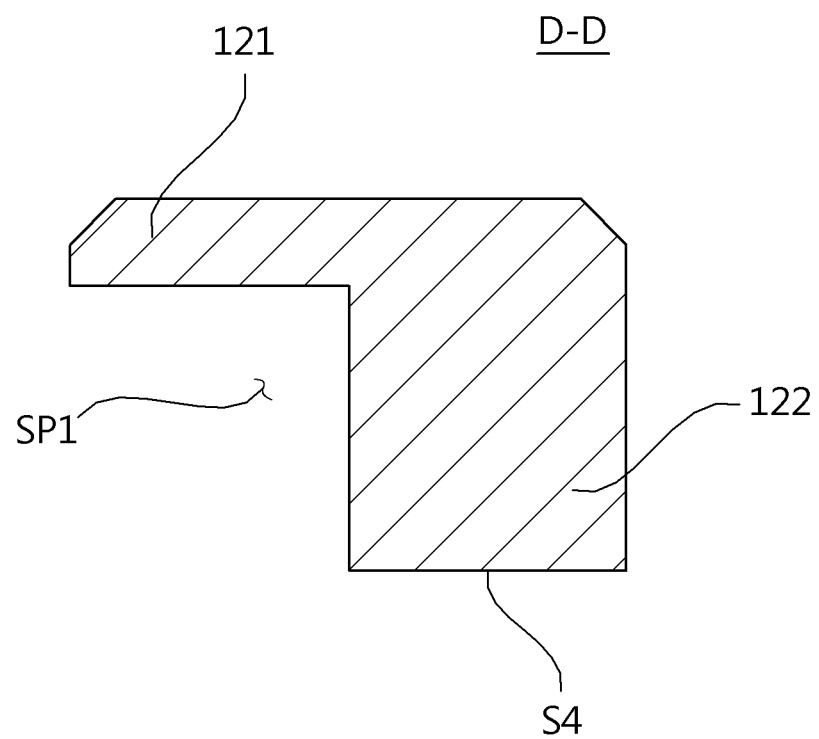
FIG. 6 is a cross-sectional view of the second part taken along line D-D of FIG. 4.
Figure 7:
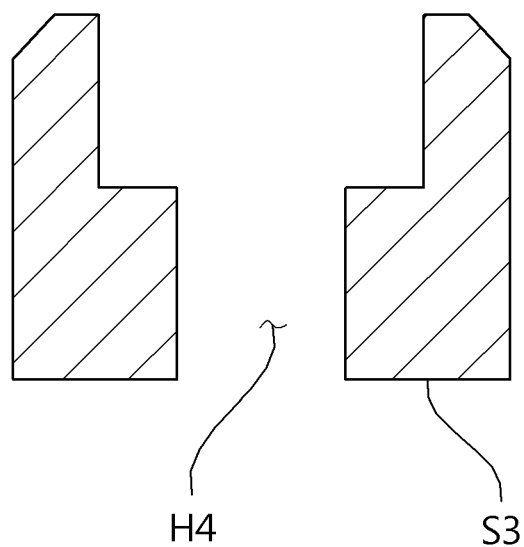
FIG. 7 is a cross-sectional view of the second part taken along line E-E of FIG. 4.

FIG. 4 is a perspective view of the second part 120, FIG. 5 is a cross-sectional view of the second part 120 taken along line C-C of FIG. 4, FIG. 6 is a cross-sectional view of the second part 120 taken along line D-D of FIG. 4, and FIG. 7 is a cross-sectional view of the second part 120 taken along line E-E of FIG. 4.

Referring to FIGS. 4 to 6, the second part 120 is a member elongated along the left-to-right direction x. The second part 120 may include a first base 121 and a first rear wall portion 122. The first rear wall portion 122 protrudes from the first base 121 in the vertical direction z. The second part 120 may have an "L"-shaped cross-sectional shape so as to have a space part SP1 formed in the front thereof in which the first part 110 is accommodated.

The second part 120 includes the first surface 51. The first surface 51 is an inner surface of the first base 121 and is a surface that pressurizes one side of the first part 110 in the vertical direction z when the second part 120 and the third part 130 are coupled to each other. In addition, the second part 120 may include the protrusion 121a that protrudes from the first surface 51 in the vertical direction z. The protrusion 121a may be disposed at the center of the second part 120 in the left-to-right direction x. Also, the protrusion 121a may be disposed at the front end of the first surface 51. The protrusion 121a is provided for restraining the first part 110 in the front-to-rear direction y and in the vertical direction z.

Referring to FIG. 7, the second part 120 may include a fourth hole H4. The second fastening portion 500 passes through the fourth hole H4. The fourth hole H4 may be disposed at each end of the second part 120 in the left-to-right direction x. The second part 120 may include a third surface S3. The third surface S3 is a surface that is in contact with the third part 130 when the second part 120 and the third part 130 are coupled to each other. The fourth surface S4 shown in FIGS. 5 and 6 is disposed to be stepped with respect to the third surface S3 in the vertical direction z. The first surface 51, the third surface S3, and the fourth surface S4 of the second part 120 may all be formed as planes parallel to the x-y plane.

Figure 8:
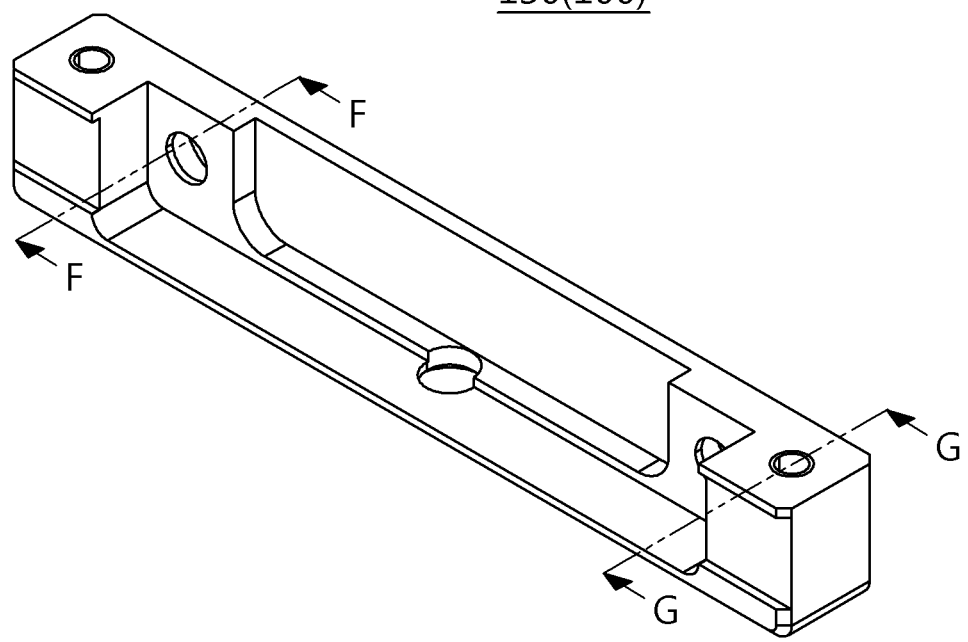
FIG. 8 is a perspective view of a third part.
Figure 9:
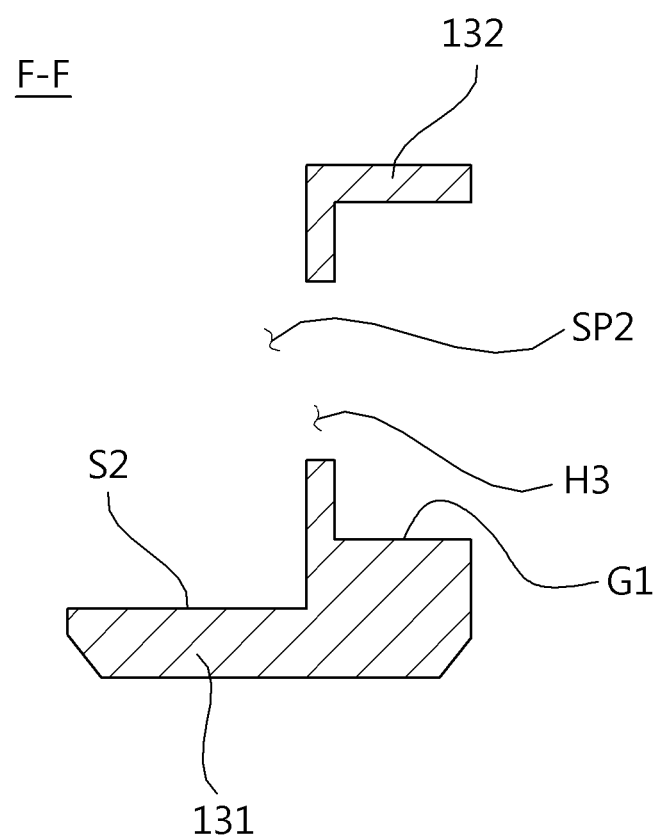
FIG. 9 is a cross-sectional view of the third part taken along line F-F of FIG. 8.
Figure 10:
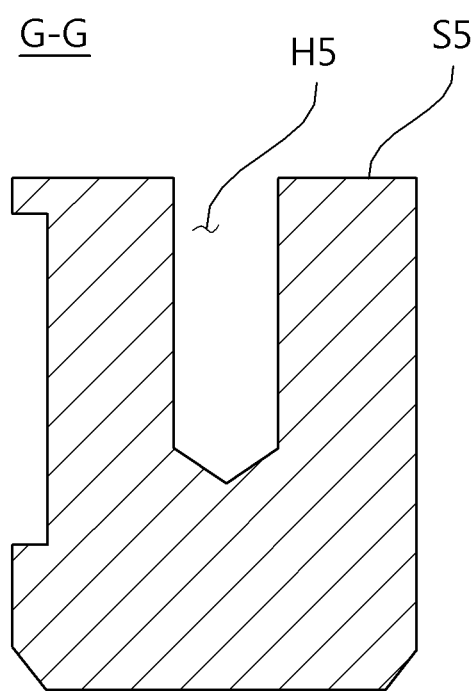
FIG. 10 is a cross-sectional view of the third part taken along line G-G of FIG. 8.

FIG. 8 is a perspective view of the third part 130, FIG. 9 is a cross-sectional view of the third part 130 taken along line F-F of FIG. 8, and FIG. 10 is a cross-sectional view of the third part 130 taken along line G-G of FIG. 8.

Referring to FIGS. 8 to 10, the third part 130 is a member elongated along the left-to-right direction x. The third part 130 may include a second base 131 and a second rear wall portion 132. The second rear wall portion 132 protrudes from the second base 131 in the vertical direction z. The third part 130 may have an "L"-shaped cross-sectional shape so as to have a space part SP2 formed in the front thereof in which the first part 110 is accommodated.

The third part 130 includes a second surface S2. The second surface S2 is an inner surface of the second base 131 and is a surface that pressurizes the other side of the first part 110 in the vertical direction z when the second part 120 and the third part 130 are coupled to each other. In addition, the second rear wall portion 132 may include a first groove G1 and a third hole H3. The first groove G1 is concavely formed at the rear surface of the second rear wall portion 132. The third hole H3 is formed in the first groove G1. The third hole H3 communicates with the space in which the first part 110 is accommodated. A head (410 in FIG. 14) of the first fastening portion 400 is placed in the first groove G1. The first fastening portion 400 is disposed to pass through the third hole H3. Referring to FIG. 10, the third part 130 may include a fifth hole H5. The fifth hole H5 is a portion to which the second fastening portion 500 is coupled. The fifth hole H5 may be disposed at each end of the third part 130 in the left-to-right direction x. The third part 130 may include a fifth surface S5. The fifth surface S5 is a surface that is in contact with the third surface S3 of the second part 120 when the second part 120 and the third part 130 are coupled to each other. The second surface S2 and the fifth surface S5 may all be formed as planes parallel to the x-y plane.

Figure 11:
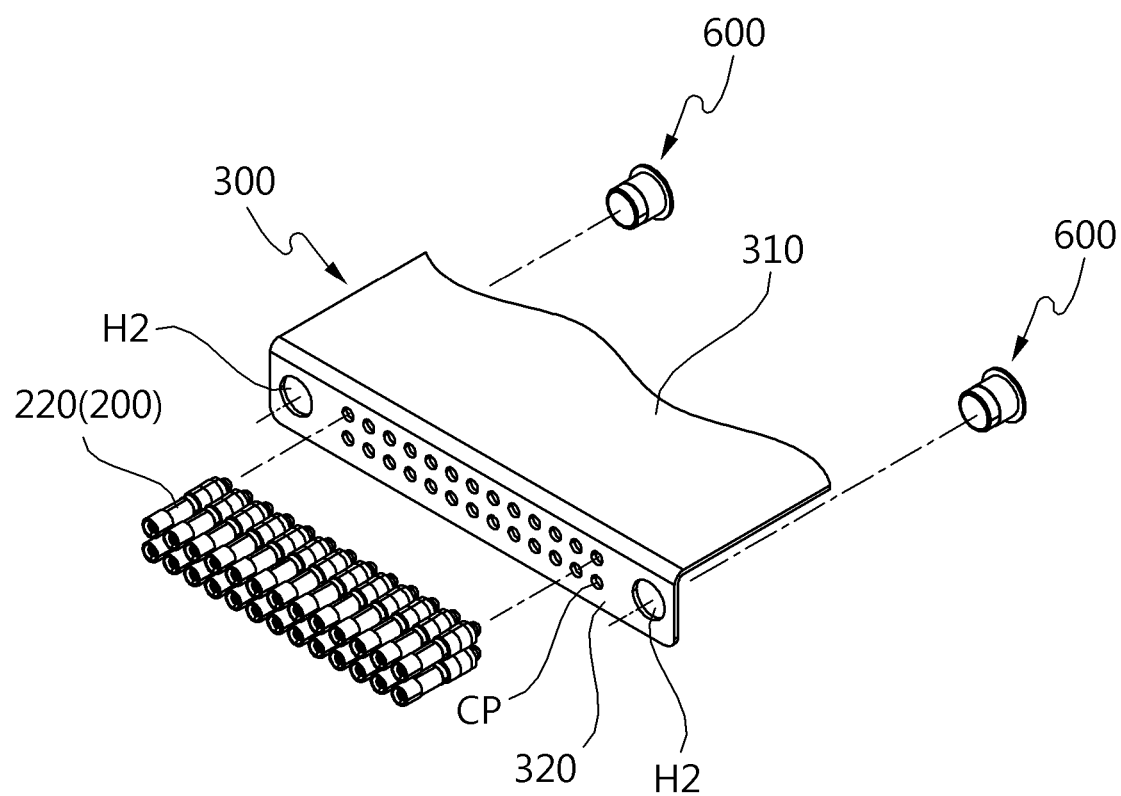
FIG. 11 is a view of a flexible printed circuit board (FPCB)

FIG. 11 is a view of the FPCB 300.

Referring to FIG. 11, the FPCB 300 may include a first region 310 and a second region 320. The first region 310 is horizontally disposed, and the second region 320 is bent from the first region 310 and is disposed along the vertical direction z. The second region 320 may have a plurality of contact points CP electrically connected to the terminals 220. In addition, the second region 320 may include a second hole H2. The hollow component 600 passes through the second hole H2. The second hole H2 may be disposed on each side of the outermost contact points CP in the left-to-right direction x. The second hole H2 of the FPCB 300, the third hole H3 of the third part 130, and the first hole H1 of the first part 110 may be disposed in alignment with one another. The second region 320 is fixed to the first part 110.

Since unlike the first region 310, the second region 320 is disposed in the vertical direction z, the terminals 220 can be directly connected to the second region 320 in the front-to-rear direction y. Therefore, the terminals 220 may be configured in a straight line without needing to bend the ends of the terminals 220 for connection with the FPCB 300. When the terminals 220 are configured in a straight line, the manufacture of the terminals 220 is simple and the rigidity of the terminals 220 is ensured even in the case of an impact applied in the front-to-rear direction y.

Figure 12:
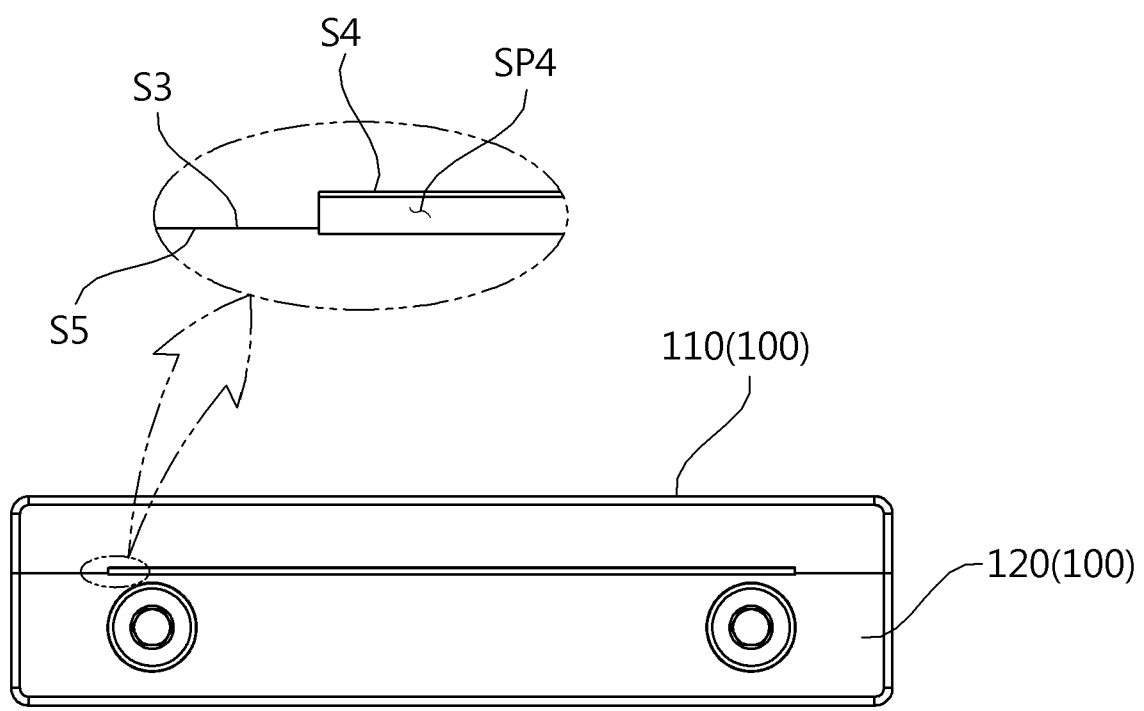
FIG. 12 is a plan view of the rear surface of a body.

FIG. 12 is a plan view of the rear surface of the body 100.

Referring to FIG. 12, when the second part 120 and the third part 130 are coupled to each other, the third surface S3 is in contact with the fifth surface S5. Since the fourth surface S4 of the second part 120 is disposed to be stepped with respect to the third surface S3, the fourth space S4 is spaced apart from the fifth surface S5 to form a space SP4. The FPCB 300 passes through the space SP4. Accordingly, the first region 310 of the FPCB 300 may be disposed between the fourth surface S4 and the fifth surface S5 in the vertical direction z.

Figure 13:
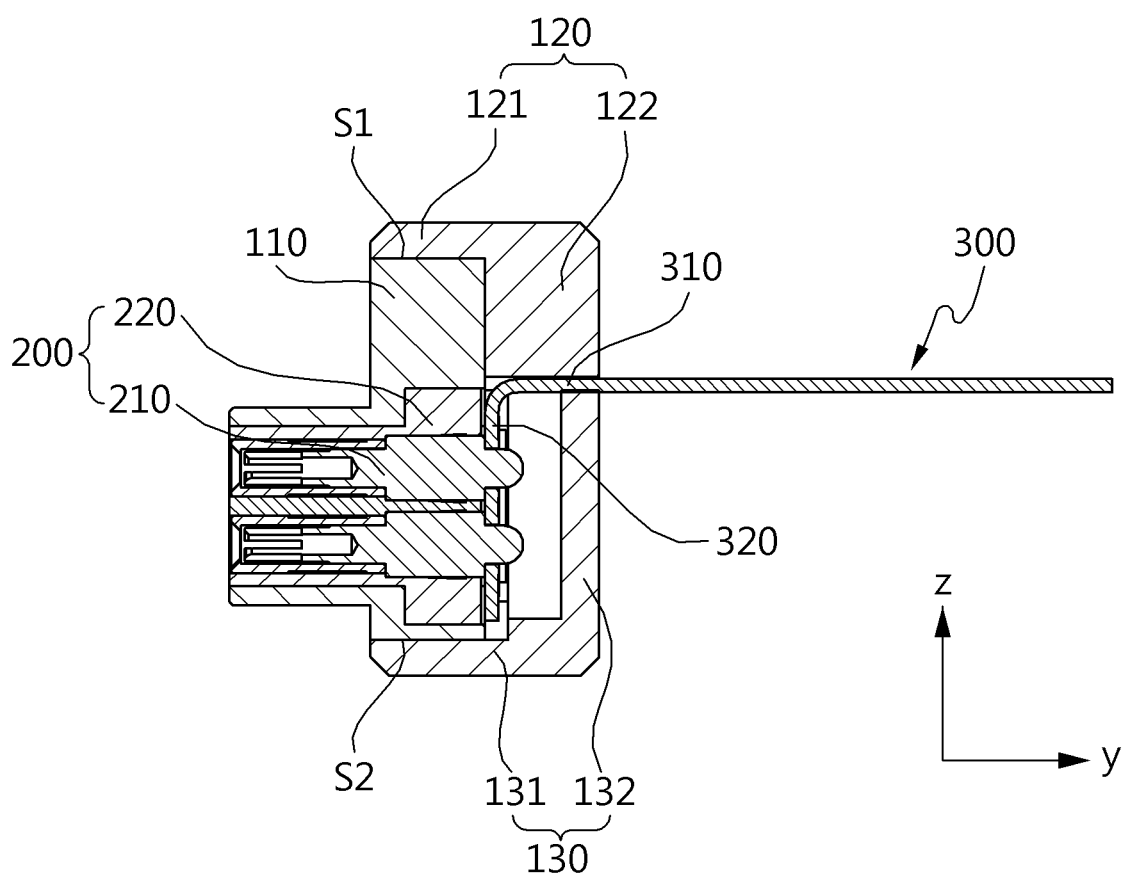
FIG. 13 is a side cross-sectional view of the electrical connector taken along line A-A of FIG. 1.

FIG. 13 is a side cross-sectional view of the electrical connector taken along line A-A of FIG. 1.

Referring to FIG. 13, the electrical connector according to an embodiment is characterized in that the second region of the FPCB 300 is directly fixed to the first part 110 in order to reduce the length of the body 100 in the front-to-rear direction y. When the coupling area of the FPCB 300 and the body 100 is disposed in the vertical direction z, the length of the body 100 in the front-to-rear direction y may be considerably reduced compared to when the coupling area of the FPCB 300 and the body 100 is horizontally disposed.

The first region 310 of the FPCB 300 is disposed between the second part 120 and the third part 130 in the vertical direction z, and the second region 320 is disposed between the first part 110 and the third part 130 in the front-to-rear direction y. The second region 320 is bent from the first region 310 and is disposed to face the rear surface of the terminal portion 200 and the rear surface of the first part 110. As such, since the second region 320 is disposed in the vertical direction z, the space occupied by the second region 320 in the front-to-rear direction y is limited to the inside of the body 100, so that the electrical connector according to an embodiment has an advantageous structure to reduce the length of the body 100 in the front-to-rear direction y.

When the second part 120 and the third part 130 are coupled to each other through the second fastening portion 500, the first surface 51 pressurizes one side of the first part 110 and at the same time, the second surface S2 pressurizes the other side of the first part 110, so that the first part 110 is fixed to the second part 120 and the third part 130. When the first part 110 is fixed to the second part 120 and the third part 130, the straight terminals 220 are connected to the second region 320 of the FPCB 300.

Figure 14:
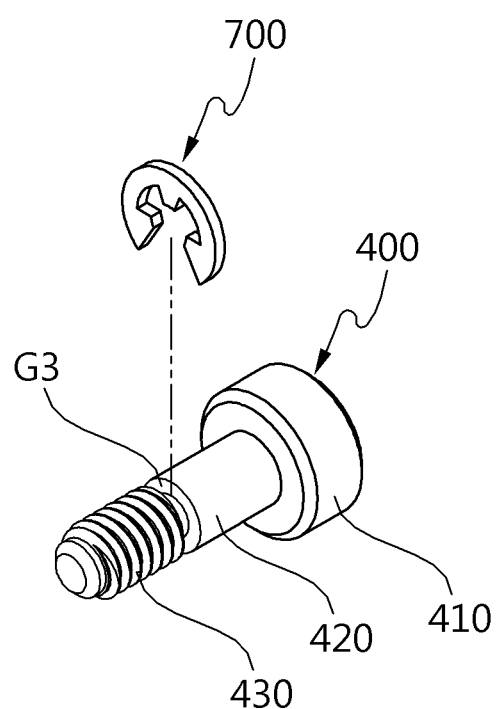
FIG. 14 is a view of a first fastening portion.

FIG. 14 is a view of the first fastening portion 400.

Referring to FIG. 14, the first fastening portion 400 may include the head 410, a middle portion 420 extending from the head 410 and having no threads, and an end portion 430 extending from the middle portion 420 and having threads formed on an outer circumferential surface thereof. The middle portion 420 may be rotatably disposed inside the hollow component 600. The end portion 430 is rotatably coupled with a mating connector. The third groove G3 may be disposed on a boundary between the middle portion 420 and the end portion 430. The fixing component 700 may be inserted into the third groove G3. The fixing component 700 inserted into the third groove G3 prevents the first fastening portion 400 from dislodging from the body 100 in the front-to-rear direction y.

Figure 15:
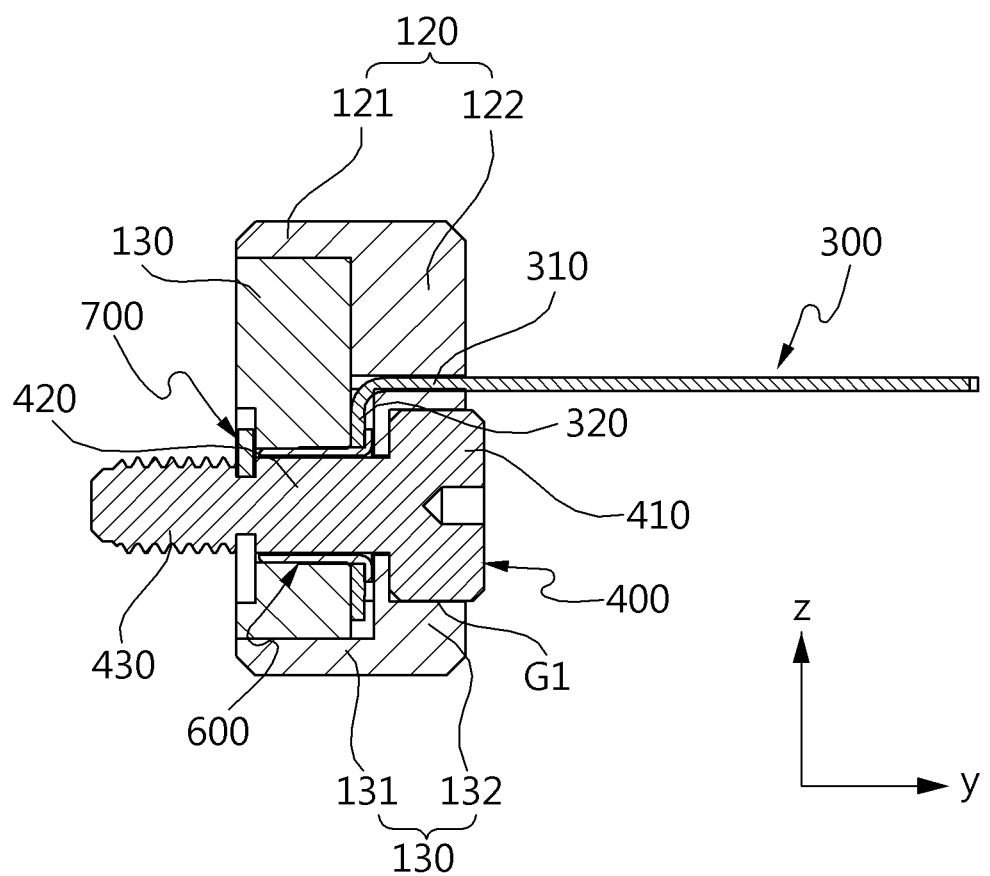
FIG. 15 is a side cross-sectional view of the electrical connector taken along line B-B of FIG. 1.

FIG. 15 is a side cross-sectional view of the electrical connector taken along line B-B of FIG. 1.

Referring to FIG. 15, the electrical connector according to the embodiment is characterized in that the first fastening portion 400 shares a coupling space with the hollow component 600 by passing through the hollow component 600 for fixing the FPCB 300 and the first part 110 to each other, thereby considerably reducing the space occupied by the fastening configurations.

The hollow component 600 is fixed to the first part 110 to fix the FPCB 300 to the first part 110, and at the same time, secures a passage through which the first fastening portion 400 passes. The first fastening portion 400 passes through the hollow component 600 such that the end portion 430 thereof is exposed to the front of the first part 110. At this time, the middle portion 420 of the first fastening portion 400 is positioned inside the hollow component 600. In addition, the head 410 of the first fastening portion 400 is inserted into the first groove G1 of the third part 130, thereby minimizing the protrusion of the first fastening portion 400 from the rear surface of the third part 130.

Such an electrical connector has an advantage in that the assembly process is simple because assembly is completed only by tightening and coupling only the second part 120 and the third part 130 through the second fastening portion 500 in a state in which the FPCB 300 is fixed to the first part 110 via the hollow component 600.

Figure 16:
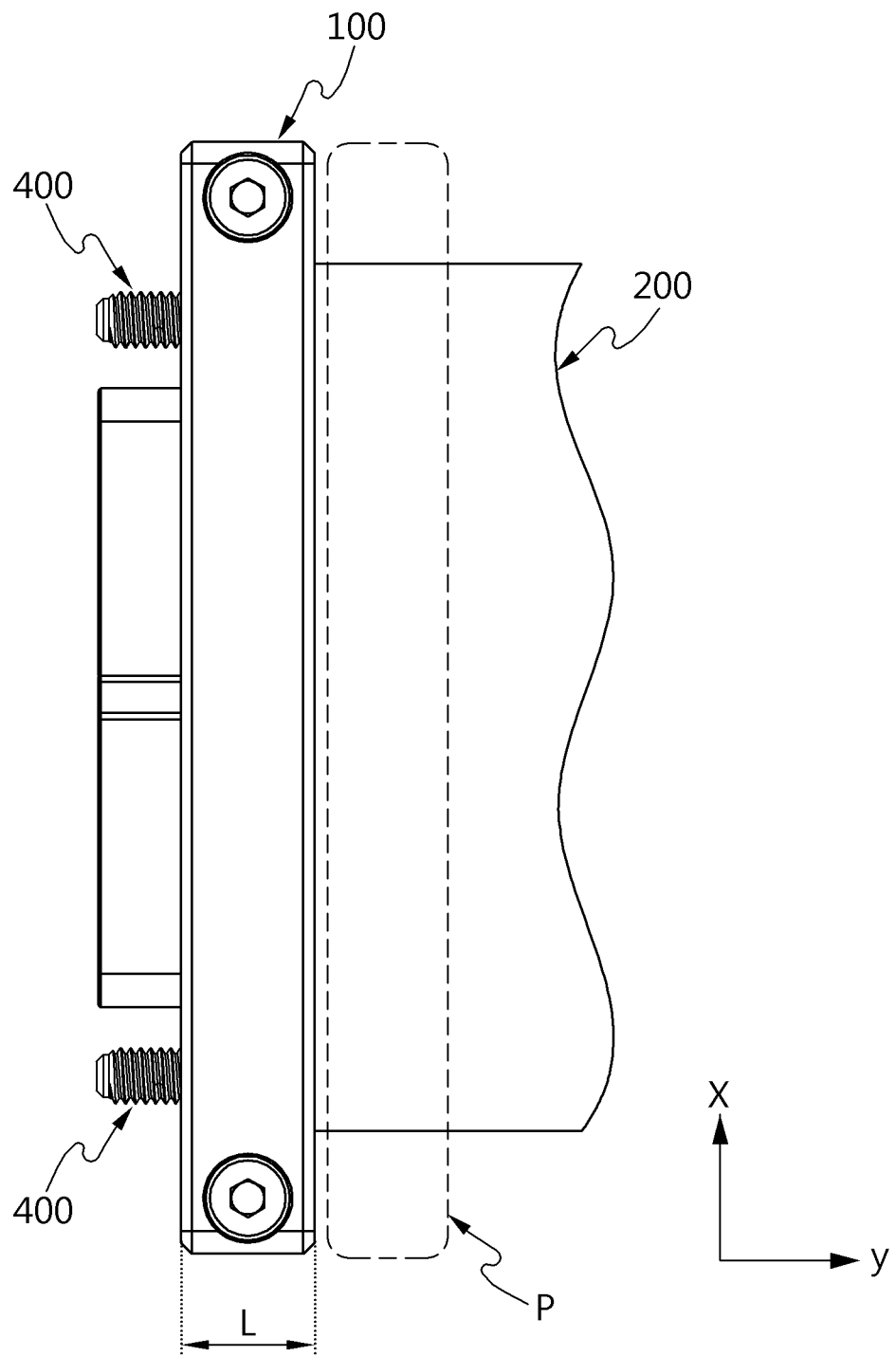
FIG. 16 is a plan view of the electrical connector shown in FIG. 1.

FIG. 16 is a plan view of the electrical connector shown in FIG. 1.

Referring to FIG. 16, since the coupling area of the FPCB 300 and the body 100 is positioned inside the body 100, the rear region of the body 100 is not necessary for coupling the FPCB 300 to the body 100, as shown in P of FIG. 16. Accordingly, the length L of the body 100 in the front-to-rear direction y can be significantly reduced. Reducing the size of the body 100 reduces the weight of the body 100, and thus the overall weight of the electrical connector can be considerably reduced.

As described above, an electrical connector according to a preferred embodiment of the present invention has been described in detail with reference to the accompanying drawings.

According to the embodiment, a portion of the FPCB including the contact points connected to the terminals is bent and disposed along the vertical direction to face the rear surface of the third part of the body positioned in the front, so that the size of the electrical connector in the front-to-rear direction can be significantly reduced.

According to the embodiment, since the shape of the terminals are formed in a straight line, it is easy to manufacture the terminals, and the rigidity of the terminals is ensured even in the case of an impact applied in the front-to-rear direction.

According to the embodiment, the first fastening portion shares space with the hollow component by passing through the hollow component for fixing the FPCB and the third part to each other, so that the space occupied by the fastening configurations is considerably reduced, thereby reducing the size of the electrical connector.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, it should be noted that such modifications or changes belong to the claims of the present invention.

What is claimed is:

1. An electrical connector comprising:
a body;
a terminal portion disposed on the body; and
a flexible printed circuit board (FPCB) electrically connected to the terminal portion,
wherein the body includes a first part on which the terminal portion is disposed, a second part disposed on one side of the first part in a vertical direction, and a third part disposed on the other side of the first part and coupled to the second part, the FPCB includes a first region and a second region extending from the first region and including a contact point connected to the terminal portion, and the second region is disposed between the first part and the third part in a front-to-rear direction and is fixed to the first part.

2. The electrical connector of claim 1, wherein the electrical connector comprises a first fastening portion passing through the body in the front-to-rear direction and rotatably disposed on the body and the first fastening portion is disposed to pass through an overlapping area of the first part, the second region of the FPCB, and the third part in the front-to-rear direction, wherein a threaded region of the first fastening portion is disposed to be exposed from the front of the first part.

3. The electrical connector of claim 1, wherein the terminal portion includes an insulator disposed on the first part and a plurality of straight terminals disposed on the insulator in the front-to-rear direction and electrically connected to the contact point and the second region of the FPCB is disposed perpendicular to the straight terminals.

4. The electrical connector of claim 1, further comprising a second fastening portion for coupling the second part and the third part in the vertical direction,
wherein the second part includes a first surface, the third part includes a second surface, and as the second part and the third part are coupled by the second fastening portion, the first surface and the second surface pressurize the first part in the vertical direction to fix the first part to the second part and the third part.

5. The electrical connector of claim 4, wherein the first part includes a first hole and the second region of the FPCB includes a second hole aligned with the first hole, the electrical connector further comprises a hollow component which passes through the first hole and the second hole to fix the FPCB to the first part, and the first fastening portion is disposed to pass through the hollow component.

6. The electrical connector of claim 4, wherein the third part includes a second base including the second surface, and a second rear wall portion protruding from the second base and disposed to overlap the first part in the front-to-rear direction, and the second region is disposed between the first part and the second rear wall portion in the front-to-rear direction.

7. The electrical connector of claim 6, wherein the second rear wall portion includes a first groove concavely disposed on an outer surface and a third hole disposed in the first groove, the first fastening portion is disposed to pass through the third hole, the second region, and the third part, and a head of the first fastening portion is disposed in the first groove.

8. The electrical connector of claim 6, wherein the second part includes a first base including the first surface, and a first rear wall portion protruding from the first base and disposed to overlap the first part in the front-to-rear direction, the first rear wall portion includes a third surface and a fourth surface, the second rear wall portion includes a fifth surface that is in contact with the third surface in the vertical direction, and the fourth surface is disposed to be stepped with respect to the third surface so that the fourth surface and the fifth surface together form a space therebetween through which the first region passes.

9. The electrical connector of claim 6, wherein the second part includes a first base including the first surface, and a first rear wall portion protruding from the first base and disposed to overlap the first part in the front-to-rear direction, and the first rear wall portion is in contact with a rear surface of the first part to support the first part so as not to be pushed rearward.

10. The electrical connector of claim 9, wherein the second part includes a protrusion protruding from the first surface and the first part includes a second groove concavely formed on a surface in contact with the first surface, wherein the protrusion is disposed in the second groove, thereby restraining the first part in the front-to-rear direction.

* * * * *